United States Patent [19]
Pierrat et al.

[11] Patent Number: 6,120,952
[45] Date of Patent: Sep. 19, 2000

[54] METHODS OF REDUCING PROXIMITY EFFECTS IN LITHOGRAPHIC PROCESSES

[75] Inventors: Christophe Pierrat, Boise, Id.; James E. Burdorf, Tualitin, Oreg.; William Baggenstoss; William Stanton, both of Boise, Id.

[73] Assignee: Micron Technology, Inc., Boise, Id.

[21] Appl. No.: 09/164,786

[22] Filed: Oct. 1, 1998

[51] Int. Cl.[7] ..................................................... G03F 9/00
[52] U.S. Cl. ................................................................ 430/30
[58] Field of Search ....................................... 430/30, 311

[56] References Cited

U.S. PATENT DOCUMENTS

| | | | |
|---|---|---|---|
| 5,242,770 | 9/1993 | Chen et al. | 430/5 |
| 5,256,505 | 10/1993 | Chen et al. | 430/5 |
| 5,340,700 | 8/1994 | Chen et al. | 430/312 |
| 5,447,810 | 9/1995 | Chen et al. | 430/5 |
| 5,587,834 | 12/1996 | Noguchi | 359/558 |
| 5,663,893 | 9/1997 | Wampler et al. | 364/491 |
| 5,698,346 | 12/1997 | Sugawara | 430/5 |
| 5,707,765 | 1/1998 | Chen | 430/5 |
| 5,795,688 | 8/1998 | Burdorf et al. | 430/30 |
| 5,858,591 | 1/1999 | Lin et al. | 430/30 |
| 5,958,635 | 9/1999 | Reich et al. | 430/30 |
| 5,972,541 | 10/1999 | Sugasawara et al. | 430/30 |

FOREIGN PATENT DOCUMENTS

| | | |
|---|---|---|
| 196 25 894 A1 | 1/1997 | Germany. |
| WO 97/45772 | 12/1997 | WIPO. |
| WO 98/38549 | 9/1998 | WIPO. |

OTHER PUBLICATIONS

Jedrasik, P., "Neural Networks Applicatio for OPC (Optical Proximity Correction) in Mask Making", Microelectronic Engineering, Conference Title: Microelectron. Eng. (Netherlands), vol. 30, No. 1–4, 1996, p. 161–4.

Jedraski, P., "Neural Networks Applicatio for OPC (Optical Proximity Correction) in Mask Making", Microelectronic Engineering, vol. 30, No. 1–4, 1996, p. 161–4.

*Phase–Shifting Structures for Isolated Features*, J.G. Garofalo, R.L. Kostelak and T.S. Yang, SPIE vol. 1463 Optical/Laser Microlithography IV (1991), pp. 151–166.

*0.3–micron optical lithography using a phase–shifting mask*, Tsuneo Terasawa, Norio Hasegawa, Toshiei Kurosaka and Toshihiko Tanaka, SPIE vol. 1088 Optical/Laser Microlithography II (1989), pp. 25–33.

*Primary Examiner*—Christopher G. Young
*Attorney, Agent, or Firm*—Wells, St. John, Roberts, Gregory & Matkin P.S.

[57] ABSTRACT

Methods of reducing proximity effects in lithographic processes wherein an integrated circuitry pattern is transferred from a mask onto a semiconductor substrate are described. In one embodiment, a desired spacing is defined between a main feature which is to reside on a mask and which is to be transferred onto the substrate, and an adjacent proximity effects-correcting feature. After the spacing definition, the dimensions of the main feature are adjusted relative to the proximity effects-correcting feature to achieve a desired transferred main feature dimension. In another embodiment, a desired spacing is defined between a main feature having an edge and an adjacent sub-resolution feature. The edge of the main feature is moved relative to the sub-resolution feature to achieve a desired transferred main feature dimension.

35 Claims, 2 Drawing Sheets

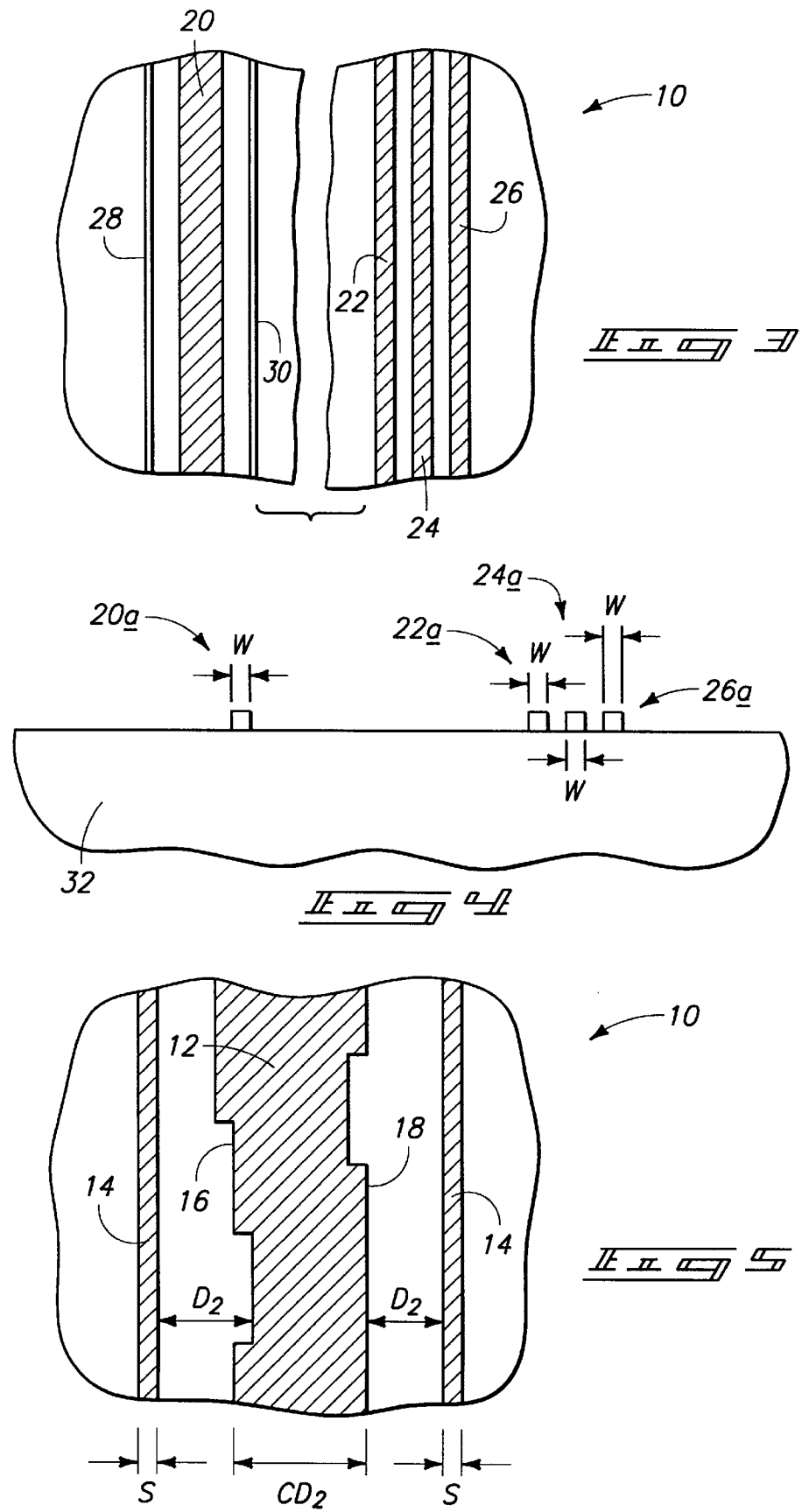

METHODS OF REDUCING PROXIMITY EFFECTS IN LITHOGRAPHIC PROCESSES

TECHNICAL FIELD

The present invention relates to methods of reducing proximity effects in lithographic processes.

BACKGROUND OF THE INVENTION

Fabrication of integrated circuitry typically involves lithographically transferring a pattern which is disposed on a mask onto a layer of material such as photoresist received over a substrate. The pattern on the mask generally defines integrated circuitry patterns and alignment patterns. It has been observed that differences in pattern development of circuit features can depend upon the proximity of the features relative to one another. So-called "proximity effects" in a lithographic process can arise during imaging, resist pattern formation, and subsequent pattern transfer steps such as etching. The magnitude of the proximity effects depends on the proximity or closeness of the two features present on the masking pattern. Proximity effects are known to result from optical diffraction in the projection system used to form the pattern over the substrate. This diffraction causes adjacent features to interact with one another in such a way as to produce pattern-dependent variations. These variations can affect the integrity of the finished devices.

This invention arose out of concerns associated with improving the manner in which integrated circuitry is formed. In particular, this invention arose out of concerns associated with reducing proximity effects.

SUMMARY OF THE INVENTION

Methods of reducing proximity effects in lithographic processes wherein an integrated circuitry pattern is transferred from a mask onto a semiconductor substrate are described. In one embodiment, a desired spacing is defined between a main feature which is to reside on a mask and which is to be transferred onto the substrate, and an adjacent proximity effects-correcting feature. After the spacing definition, the dimensions of the main feature are adjusted relative to the proximity effects-correcting feature to achieve a desired transferred main feature dimension. In another embodiment, a desired spacing is defined between a main feature having an edge and an adjacent sub-resolution feature. The edge of the main feature is moved relative to the sub-resolution feature to achieve a desired transferred main feature dimension.

BRIEF DESCRIPTION OF THE DRAWINGS

Preferred embodiments of the invention are described below with reference to the following accompanying drawings.

FIG. 3 is a top plan view of a mask pattern in accordance with one embodiment of the present invention.

FIG. 4 is a side elevational view of the semiconductor wafer fragment which has been processed in accordance with one embodiment of the invention.

FIG. 5 is a top plan view of a portion of a mask pattern in accordance with one embodiment of the invention.

DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
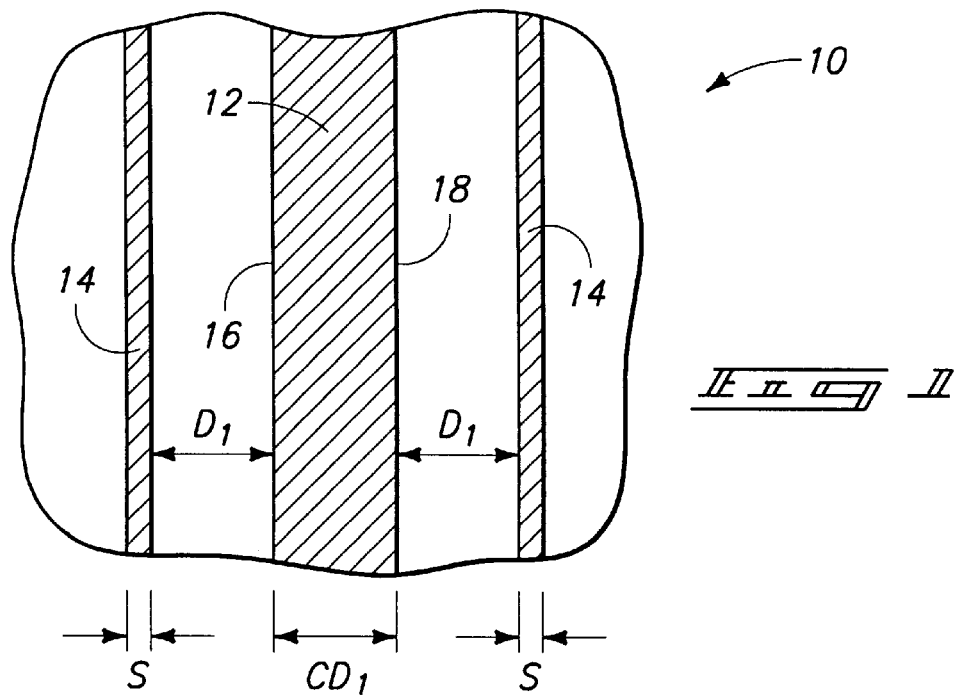
FIG. 1 is a top plan view of a portion of a mask pattern.

Referring to FIG. 1, a portion of a mask pattern on a mask is shown generally at 10 and comprises at least one main feature 12 and at least one proximity effects-correcting feature 14. In this example, two proximity effects-correcting features 14 are shown. Mask 10 is to be utilized in a lithographic process wherein an integrated circuitry pattern corresponding to main feature 12 is transferred from the mask onto a semiconductor substrate. In the illustrated example, main feature 12 has a plurality of sides or edges 16, 18 which define a first width dimension. For purposes of the ongoing discussion, side 16 comprises a first side and side 18 comprises a second side. The illustrated first and second sides are generally parallel with one another and are laterally displaced from proximity effects-correcting features 14. A proximity effects-correcting feature is disposed on either side of main feature 12. It is possible, however, for only one proximity effects-correcting feature to be disposed on one side of main feature 12.

In the illustrated and preferred embodiment, proximity-effects correcting features 14 comprise sub-resolution features which are not ultimately transferred onto the substrate. In this example, main feature 12 comprises a conductive line pattern which is to be transferred onto a substrate. Any number of main features can be defined on the mask. Accordingly, a plurality of main features comprising conductive line patterns can be defined on the mask. Main feature 12 and proximity effects-correcting features 14 each have respective width dimensions, with the width dimension of the proximity effects-correcting features 14 being shown at S, and the width of main feature 12 being shown at $CD_1$. The proximity effects-correcting features can have different widths.

In accordance with one embodiment of the invention, a desired spacing $D_1$ is defined between main feature 12 and at least one adjacent proximity effects-correcting feature 14. The desired spacing between the main feature and the proximity effects-correcting features can be the same, as is shown, or can be different. In this example, and because there are two illustrated proximity effects-correcting features, two such desired spacings are defined which happen to be the same in magnitude. In one embodiment, the definition of the desired spacing is conducted to optimize the depth of focus (DOF) in the lithographic process. Depth of focus is an important characteristic of an exposure tool and is defined as the range in which the aerial image (of a near resolution sized feature) will stay in focus. In a lithographic process in which an image is transferred into a photoresist layer, a minimum or optimized DOF is required. This minimum or optimized DOF ensures that the image remains sufficiently in focus throughout the resist layer. Thus, the minimum or optimized DOF range is typically greater than or equal to the thickness of the resist layer. Other parameters can, of course, be considered in the context of defining the desired spacing between a main feature and a proximity effects-correcting feature, e.g. exposure latitude and image log slope.

Figure 2:
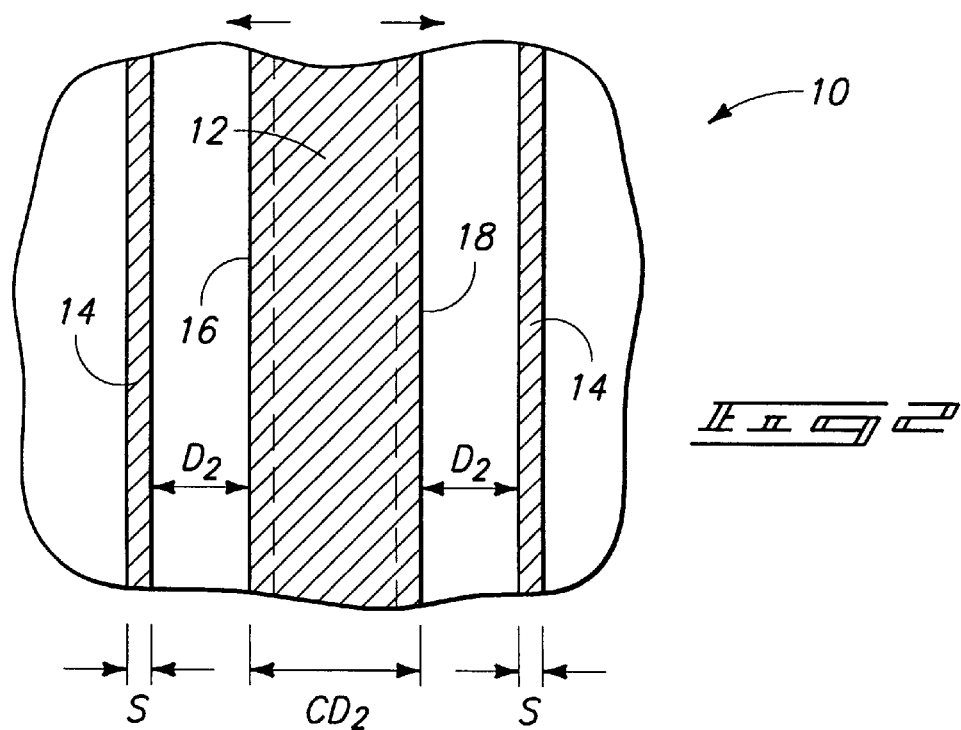
FIG. 2 is a top plan view of a portion of a mask pattern in accordance with one embodiment of the invention.

Referring to FIG. 2, the dimensions or shape of main feature 12 are adjusted relative to the proximity effects-correcting feature (S) to achieve a desired transferred main feature dimension. The dimensional or shape adjustment of the main feature can take place through a change in the area size of the main feature. In the illustrated example, the area size of main feature 12 is adjusted by increasing the area size from that which is shown in FIG. 1 to that which is shown in FIG. 2. Such adjustment takes place by moving at least a portion of one or both of sides or edges 16, 18 from its previous position (shown in dashed lines), to its illustrated position in FIG. 2. In this example, both of sides or edges 16, 18 are moved or repositioned relative to their original positions.

The adjustment of the main feature dimension can take place through movement of an associated side or edge, or a portion(s) thereof, either toward or away from an adjacent proximity effects-correcting feature. Where only one proximity effect-correcting feature is used, movement of the associated side of the main feature can take place toward or away from the proximity effects-correcting feature. In this example, each side is repositioned by moving it closer to or toward its next adjacent proximity effects-correcting feature. Movement of one or more of the edges can, however, be conducted away from a proximity effects-correcting feature or, particularly, away from a next-adjacent proximity effects-correcting feature. Such movement can either increase or decrease the dimensions of the main feature. The main feature shape or dimension can also be adjusted by moving individual portions of individual sides toward or away from the proximity effects-correcting feature. Such can result in a staggered construction such as is shown in FIG. 5.

In a preferred embodiment, the desired transferred main feature dimension which is ultimately formed over a substrate is approximately equal to a minimum photolithographic feature size from which the integrated circuitry is fabricated. This will become more apparent in connection with the discussion relative to FIG. 4.

In a preferred embodiment, a width dimension of main feature 12, i.e. $CD_1$, is changed without changing any dimensions of the proximity effects-correcting or sub-resolution features. Specifically, and as is apparent from a comparison of FIGS. 1 and 2, $CD_2$ of main feature 12 is different from and, in this example greater than $CD_1$ in FIG. 1. At the same time, the widths of the proximity effects-correcting features 14, i.e. S, are consistent between FIGS. 1 and 2. Such change in main feature width also changes the spacing between the main feature and its associated proximity effects-correcting feature. Specifically, a spacing $D_2$ (FIG. 2) is defined between the main feature and each of the associated proximity effects-correcting features 14. In this example, $D_2$ is less than $D_1$. The spacing $D_2$ can vary as between a main feature's sides and the next-adjacent proximity effects-correcting features, or between different portions of a main feature's side and the next-adjacent proximity effects-correcting feature for that side.

Referring to FIG. 3, a plurality of main features 20, 22, 24, and 26, e.g. conductive line patterns, are defined on a mask. As initially defined, however, and not specifically illustrated here, main features 20–26 would have substantially common width dimensions. However, due to proximity effects, the ultimately provided patterned main features over the substrate corresponding to the main features on a mask would not result in uniformly-patterned main features over the substrate.

As ultimately provided on mask 10, however, main features 22, 24, and 26 would have width dimensions comparable to $CD_1$, which is shown in FIG. 1, and main feature 20 would have a width dimension comparable to $CD_2$ which is shown in FIG. 2. With these width dimensions, main feature patterns can be formed over a substrate with width dimensions which are no greater than a minimum photolithographic feature size from which the integrated circuitry is fabricated. Main feature 20, and more likely a plurality of similar main features are spaced from other main features a distance which is effective to form one or more patterned main features over the substrate which is (are) spaced from other patterned main features a distance which is greater than the minimum photolithographic feature size. This variation in spacing is one factor which can lead to proximity effect-related irregularities in the ultimately patterned feature.

Prior to provision of the illustrated mask in FIG. 3, processing can take place with respect to main feature 20 as described above in connection with FIGS. 1 and 2. Specifically, a desired spacing is defined between main feature 20 and at least one proximity effects-correcting features 28, 30. After definition of the desired spacing which, in a preferred embodiment, is selected to achieve a desired depth of focus (DOF), at least portions of one or more of the sides or edges of main feature 20 are moved or repositioned to define a second width dimension (corresponding to $CD_2$ in FIG. 2) which is different from the first originally-defined width dimension. In the illustrated example, both of the sides or edges have been moved or repositioned to be closer to their next adjacent or nearest proximity effects-correcting feature 28, 30. Accordingly, such movement increases the area size of the main feature 20. Changing the dimensional size, shape, or area of the main feature as just described, relative to one or more adjacent proximity effects-correcting features, can enable a patterned main feature to be formed on the substrate to have a width dimension which is no greater than a minimum photolithographic feature size which is utilized to form the integrated circuitry.

For example, and with respect to FIG. 4, a plurality of conductive lines 20a, 22a, 24a, and 26a are formed over a substrate 32. Lines 20a–26a have been formed through the use of a mask such as one containing main feature patterns 20–26. As can be seen, each formed conductive line has a width w which, in a preferred embodiment, is no greater than the minimum photolithographic feature size from which the integrated circuitry is formed. It will be observed that the conductive line 20a (corresponding to main feature 20 (FIG. 3)) has a width which is similar to, or the same as the widths of conductive lines 22a–26a which are spaced closer together. Accordingly, proximity effects which previously affected the subsequently patterned main feature widths have been substantially reduced, if not eliminated. Thus, lines 20a–26a have substantially common patterned width dimensions.

Advantages achieved by the various embodiments of the invention include better dimensional control of substrate features through correction of the defined main features after placement of the proximity effects-correcting features. This can also reduce processing overhead through reductions in the data volume required to implement the various methods by the various industry processors utilized to do so.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of reducing proximity effects in a lithographic process wherein an integrated circuitry pattern is transferred from a mask onto a semiconductor substrate, the method comprising:

defining a desired spacing between a main feature which is to reside on the mask and which is to be transferred onto the substrate and a pair of adjacent proximity effects-correcting features disposed on opposing sides of the main feature; and after said defining, adjusting dimensions of the main feature relative to the pair of proximity effects-correcting features to achieve a desired transferred main feature dimension.

2. The method of claim 1, wherein defining the desired spacing comprises selecting a spacing to optimize depth of focus in the lithographic process.

3. The method of claim 1, wherein adjusting comprises changing an area of the main feature.

4. The method of claim 1, wherein adjusting comprises changing a shape of the main feature.

5. The method of claim 1, wherein adjusting comprises increasing an area of the main feature.

6. The method of claim 1, wherein the main feature has a plurality of sides and wherein adjusting comprises moving at least a portion of one of the sides.

7. The method of claim 1, wherein the main feature has a plurality of sides and wherein adjusting comprises moving at least a portion of at least one of the sides.

8. The method of claim 1, wherein the main feature has first and second sides which are generally parallel with one another and laterally displaced from the pair of proximity effects-correcting features, and wherein adjusting comprises moving portions of each of the first and second sides.

9. The method of claim 1, wherein the main feature has first and second sides which are spaced apart from one another, and wherein adjusting comprises repositioning at least a portion of one of the first and second sides relative to its next adjacent proximity effects-correcting feature.

10. The method of claim 1, wherein the main feature has first and second sides which are spaced apart from one another, and wherein adjusting comprises repositioning portions of each of the first and second sides relative to its next adjacent proximity effects-correcting feature.

11. A method of reducing proximity effects in a lithographic process wherein an integrated circuitry pattern is transferred from a mask onto a semiconductor substrate, the method comprising:

defining a desired spacing between a main feature which is to reside on the mask and which is to be transferred onto the substrate and a pair of adjacent sub-resolution features disposed on opposing sides of the main feature, the main feature having parallel edges; and moving each of the edges of the main feature relative to a respective adjacent one of the pair of sub-resolution features to achieve a desired transferred main feature dimension.

12. The method of claim 11, wherein defining comprises selecting the spacing to achieve a desired depth of focus.

13. The method of claim 11, wherein moving comprises moving each edge away from the respective adjacent one of the pair of sub-resolution features.

14. The method of claim 11, wherein moving comprises moving each edge towards the respective adjacent one of the pair of sub-resolution features and increasing dimensions of the main feature.

15. The method of claim 11, wherein moving comprises moving each edge toward the respective adjacent one of the pair of sub-resolution features.

16. The method of claim 11, wherein moving comprises moving each edge toward the respective adjacent one of the pair of sub-resolution features and increasing dimensions of the main feature.

17. The method of claim 11, wherein moving increases dimensions of the main feature.

18. The method of claim 11, wherein the main feature comprises a conductive line pattern, and the desired transferred main feature dimension is approximately equal to a minimum photolithographic feature size from which the integrated circuitry is fabricated.

19. The method of claim 11, wherein the main feature comprises a conductive line pattern and moving increases dimensions of the main feature, and wherein the desired transferred main feature dimension is approximately equal to a minimum photolithographic feature size from which the integrated circuitry is fabricated.

20. A method of reducing proximity effects in a lithographic process wherein an integrated circuitry pattern is transferred from a mask onto a semiconductor substrate, the method comprising:

defining a plurality of main features which are to appear on the mask and be transferred onto a substrate, the main features having width dimensions;

defining a desired spacing between a pair of sub-resolution features disposed on opposing sides of one of the main features and the one of the main features;

changing a width dimension of the one main feature and not changing any dimensions of the pair of sub-resolution features; and forming a plurality of patterned main features on the substrate using the mask, said plurality of main features having substantially common patterned width dimensions.

21. The method of claim 20, wherein forming the plurality of patterned main features comprises forming the plurality of features to have width dimensions approximately equal to a minimum photolithographic feature size from which the integrated circuitry is formed.

22. The method of claim 20, wherein defining the desired spacing comprises selecting the desired spacing to achieve a desired depth of focus.

23. The method of claim 20, wherein defining the plurality of main features comprises defining at least one conductive line pattern.

24. The method of claim 20, wherein defining the plurality of main features comprises defining at least one conductive line pattern, and forming the plurality of patterned main features comprises forming the plurality of features to have at least one conductive line width approximately equal to a minimum photolithographic feature size from which the integrated circuitry is formed.

25. The method of claim 20, wherein defining the plurality of main features comprises defining a plurality of conductive line patterns.

26. The method of claim 20, wherein:

defining the plurality of main features comprises defining a plurality of conductive line patterns; and changing the width dimension comprises moving one of the opposing edges toward a nearest of the pair of sub-resolution features.

27. The method of claim 20, wherein:

defining the plurality of main features comprises defining a plurality of conductive line patterns; and changing the width dimension comprises moving each of the opposing edges toward a respective one of the pair of sub-resolution features, each edge being a nearest of the spaced-apart edges relative to each of the pair of sub-resolution features.

28. A method of reducing proximity effects in a lithographic process wherein an integrated circuitry pattern is transferred from a mask onto a semiconductor substrate, the method comprising:

defining a plurality of main features which are to appear on the mask at least some of which having width dimensions effective to form main feature patterns over a substrate with width dimensions which are no greater than a minimum photolithographic feature size from which the integrated circuitry is fabricated, one of the main features being spaced from other main features a distance which is effective to form a patterned main feature over the substrate which is spaced from other patterned main features over the substrate a distance which is greater than the minimum photolithographic feature size, the one main feature having a pair of edges defining a first width dimension;

defining a desired spacing between the one main feature and each of a pair of proximity effects-correcting features, each of the pair to appear on the mask adjacent to opposing sides of the one main feature; and after said defining of the desired spacing, moving one of the opposing edges of the one main feature to define a second width dimension which is different from the first width dimension, moving enabling a patterned main feature to be formed on the substrate corresponding to the one main feature to have a width dimension which is no greater than the minimum photolithographic feature size.

29. The method of claim 28, wherein defining a desired spacing comprises defining a desired spacing between the one main feature and each of the pair of sub-resolution proximity effects-correcting features.

30. The method of claim 28, wherein defining the desired spacing comprises defining the desired spacing to achieve a maximum depth of focus.

31. The method of claim 28, wherein moving opposing edges of the one main feature comprises moving an edge nearest each of the pair of proximity effects-correcting features.

32. The method of claim 28, wherein moving opposing edges of the one main feature comprises moving an edge nearest each of the pair of proximity effects-correcting features toward each of the pair of proximity effects-correcting features.

33. The method of claim 28, wherein moving comprises moving the opposing edges of the one main feature to define the second width to be greater than the first width.

34. The method of claim 28, wherein moving opposing edges of the one main feature comprises moving an edge nearest each of the pair of proximity effects-correcting features to define the second width to be greater than the first width.

35. The method of claim 28, wherein defining the plurality of main features comprises defining a plurality of conductive line patterns.

* * * * *